(12) United States Patent
Cho et al.

(10) Patent No.: US 10,008,666 B2
(45) Date of Patent: Jun. 26, 2018

(54) NON-VOLATILE RESISTIVE MEMORY CELLS

(75) Inventors: Hans S Cho, Palo Alto, CA (US); Janice H Nickel, Pacifica, CA (US); R. Stanley Williams, Portola Valley, CA (US); Jaesung Roh, Icheon-si (KR); Jinwon Park, Icheon-si (KR); Choi Hyejung, Icheon-si (KR); Moonsig Joo, Icheon-si (KR); Jiwon Moon, Icheon-si (KR); Changgoo Lee, Icheon-si (KR); Yongsun Sohn, Icheon-si (KR); Jeongtae Kim, Icheon-si (KR)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 14/396,406

(22) PCT Filed: Jul. 31, 2012

(86) PCT No.: PCT/US2012/048941
§ 371 (c)(1),
(2), (4) Date: Oct. 23, 2014

(87) PCT Pub. No.: WO2014/021833
PCT Pub. Date: Feb. 6, 2014

(65) Prior Publication Data
US 2015/0076438 A1  Mar. 19, 2015

(51) Int. Cl.
*H01L 45/00* (2006.01)
*H01L 27/10* (2006.01)
*H01L 27/24* (2006.01)

(52) U.S. Cl.
CPC ........ *H01L 45/1233* (2013.01); *H01L 27/101* (2013.01); *H01L 45/08* (2013.01);
(Continued)

(58) Field of Classification Search
CPC .................. H01L 45/1233; H01L 45/124
See application file for complete search history.

(56) References Cited

U.S. PATENT DOCUMENTS 7,675,052 B2 * 3/2010 Kim .................. H01L 45/04
257/2
8,105,884 B2   1/2012 Lee et al.
(Continued)

FOREIGN PATENT DOCUMENTS

CN     101840994     9/2010
JP     2008-257789 A  10/2008
(Continued)

OTHER PUBLICATIONS

Partial translation of JP 2010-212541, Jun. 2016.*
(Continued)

*Primary Examiner* — Mark Prenty
(74) *Attorney, Agent, or Firm* — Brooks, Cameron & Huebsch, PLLC

(57) ABSTRACT

Examples of the present disclosure include non-volatile resistive memory cells and methods of forming the same. An example of a non-volatile resistive memory cell includes a first portion of the non-volatile resistive memory cell formed as a vertically-extending structure on a first electrode, where the first portion comprises at least one memristive material across a width of the vertically-extending structure. The non-volatile resistive memory cell also includes a second portion formed as a vertically-extending memristive material structure on at least one sidewall of the first portion.

7 Claims, 5 Drawing Sheets

(52) U.S. Cl.
CPC ........ *H01L 45/124* (2013.01); *H01L 45/1253* (2013.01); *H01L 45/146* (2013.01); *H01L 45/1641* (2013.01); *H01L 45/1675* (2013.01); *H01L 45/1691* (2013.01); *H01L 27/2463* (2013.01)

(56) References Cited

U.S. PATENT DOCUMENTS

| | | | |
|---|---|---|---|
| 8,158,963 B2 | 4/2012 | Ho et al. | |
| 8,921,155 B2* | 12/2014 | Zhou | H01L 45/1675 257/E21.006 |
| 9,111,609 B2* | 8/2015 | Happ | G11C 13/0004 |
| 9,123,888 B2* | 9/2015 | Sills | H01L 45/085 |
| 2004/0026686 A1 | 2/2004 | Lung | |
| 2007/0096073 A1 | 5/2007 | Dennison et al. | |
| 2008/0083916 A1 | 4/2008 | Kim | |
| 2008/0094873 A1 | 4/2008 | Lai et al. | |
| 2008/0246014 A1 | 10/2008 | Lung | |
| 2008/0247219 A1 | 10/2008 | Choi et al. | |
| 2009/0250681 A1 | 10/2009 | Smythe et al. | |
| 2012/0001145 A1 | 1/2012 | Magistretti et al. | |
| 2012/0080725 A1 | 4/2012 | Manos et al. | |
| 2012/0099367 A1 | 4/2012 | Azuma et al. | |
| 2013/0112935 A1 | 5/2013 | Himeno et al. | |

FOREIGN PATENT DOCUMENTS

| | | |
|---|---|---|
| JP | 2010212541 | 9/2010 |
| KR | 10-0801084 B1 | 2/2008 |
| KR | 10-2008-0031668 A | 4/2008 |
| KR | 10-2011-0086089 A | 7/2011 |
| KR | 10-2012-0012049 A | 2/2012 |
| WO | WO-2012073503 | 6/2012 |

OTHER PUBLICATIONS

Kinoshita, K. et al., Lowering the Switching Current of Resistance Random Access Memory Using a Hetero Junction Structure Consisting of Transition Metal Oxides, (Research Paper), Japanese Journal of Applied Physics, Sep. 15, 2006, vol. 45, No. 37, pp. L991-L994.

PCT International Search Report & Written Opinion, dated Mar. 29, 2013, PCT Patent Application No. PCT/US2012/048941, 9 pages.

Supplementary European Search Report, European Patent Application No. 12882243.4, dated Mar. 4, 2016, 10 pages.

* cited by examiner ant to the figure number and the remaining digits identify an element

NON-VOLATILE RESISTIVE MEMORY CELLS

BACKGROUND

Research and development efforts are directed toward designing and manufacturing non-volatile resistive memory cells, such as for use in crossbar memory arrays. Such electronics may enable significant advances, including markedly reduced component sizes. However, the design and manufacture of such electronic devices may present a number of challenges.

DETAILED DESCRIPTION

Figure 1:
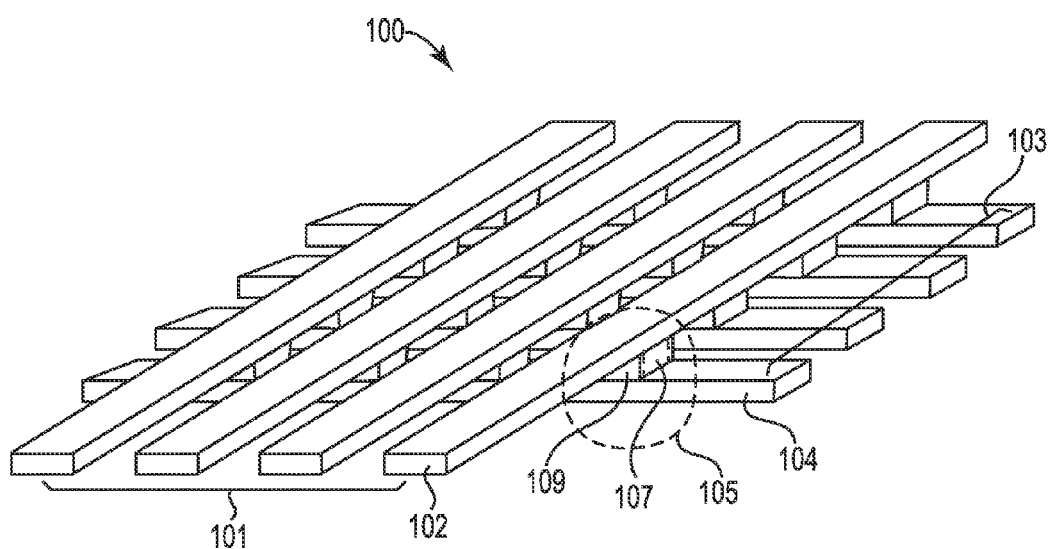
FIG. 1 illustrates an example of a schematic perspective view of a crossbar array of non-volatile resistive memory cells in accordance with the present disclosure.

Nanoscale devices using switching materials, such as titanium oxide and others presented herein, show resistive switching behavior. The switching behavior of such devices has been identified as a memristor circuit element. The discovery of the memristive behavior, applied to nanoscale switches, has generated interest and on-going research efforts to implement the memristive behavior in various applications. One of many potential applications is to use such switching materials in memory cells to store digital data. An array of such memory cells formed with switching materials (e.g., elements) can be constructed in a crossbar configuration to provide a high device density. There are, however, technical issues to be addressed in order to improve fabrication and/or reliability issues pertaining to memory cells and/or arrays having switching elements.

Among such issues is maintaining switching characteristics of the switching elements over multiple ON/OFF cycles to provide an acceptable operation life (e.g., via reduction of OFF state and/or total currents, as described herein). Protection of a switching element and/or components associated therewith from adverse effects (e.g., damage and/or contamination resulting from processes associated with fabrication of the non-volatile resistive memory cells and/or arrays thereof) can contribute to reducing probabilities of such issues. For example, if a switching oxide, as described herein, is formed (e.g., deposited) early in a fabrication process, damage and/or contamination may potentially result from subsequent etching in the vicinity of the switching oxide. Thus, formation (e.g., deposition) of the switching element later in the fabrication process can reduce damage to and/or contamination of (e.g., passivate) the switching oxide. The non-volatile resistive memory cells and/or arrays thereof thus fabricated may have a better switching ON/OFF ratio, a reduction of OFF state and/or total currents, a lower initial resistance, a longer endurance, and/or a longer data retention, among other benefits.

Examples of the present disclosure include non-volatile resistive memory cells and methods of forming the same. An example of a non-volatile resistive memory cell includes a first portion of the non-volatile resistive memory cell formed as a vertically-extending structure on a first electrode, where the first portion includes at least one memristive material across a width of the vertically-extending structure. The non-volatile resistive memory cell also includes a second portion formed as a vertically-extending memristive material structure on at least one sidewall of the first portion. Memristive materials can be defined as having a controllable state variable that determines an electrical property (e.g., resistivity) of the material. Memristive materials can be oxides, sulfides, selenides, nitrides, carbides, phosphides, arsenides, chlorides, and/or bromides of transition and/or rare earth metals, among other materials presented herein or otherwise.

FIG. 1 illustrates an example of a schematic perspective view of a crossbar array of non-volatile resistive memory cells in accordance with the present disclosure. FIG. 1 shows an example of a two-dimensional array 100 of such non-volatile resistive memory cells (e.g., memristors). The array 100 has a first group 101 of generally parallel conductor lines 102 (e.g., bit lines) in a top layer, and a second group 103 of generally parallel conductor lines 104 (e.g., word lines) in a bottom layer. The conductor lines 102 in the first group 101 run in a first direction, and the conductor lines 104 in the second group 103 run in a second direction at an angle (e.g., orthogonally) from the first direction. The two layers of conductor lines 102, 104 form a two-dimensional crossbar structure, with each conductor line 102 in the top layer crossing over a plurality of the conductor lines 104 of the bottom layer.

In the detailed description of the present disclosure, reference is made to the accompanying drawings that form a part hereof and in which is shown by way of illustration how examples of the disclosure may be practiced. These examples are described in sufficient detail to enable those of ordinary skill in the art to practice the examples of this disclosure and it is to be understood that other examples may be utilized and that process, electrical, and/or structural changes may be made without departing from the scope of the present disclosure. Further, where appropriate, as used herein, "for example" and "by way of example" should be understood as abbreviations for "by way of example and not by way of limitation".

The figures herein follow a numbering convention in which the first digit or digits correspond to the drawing figure number and the remaining digits identify an element or component in the drawing. Similar elements or components between different figures may be identified by the use of similar digits. For example, 111 may reference element "11" in FIG. 1, and a similar element may be referenced as 211 in FIG. 2. Elements shown in the various figures herein may be added, exchanged, and/or eliminated so as to provide a number of additional examples of the present disclosure. In addition, the proportion and the relative scale of the elements provided in the figures are intended to illustrate the examples of the present disclosure and should not be taken in a limiting sense.

A non-volatile resistive memory cell 105, as illustrated in FIG. 1, may be formed at each location where the conductor lines intersect in the array 100. The non-volatile resistive memory cell 105 can be interfaced with the conductor line 102 in the first group 101 to serve as a top electrode or the non-volatile resistive memory cell 105 can be interfaced with an intervening conductive material (not shown) to serve as the top electrode. Similarly, the non-volatile resistive memory cell 105 can be interfaced with the conductor line 104 in the second group 103 to serve as a bottom electrode or the non-volatile resistive memory cell 105 can be interfaced with an intervening conductive material (not shown) to serve as the bottom electrode.

A region containing a switching element 107 is between the top and bottom conductor lines 102, 104 and a protective spacer material 109 can, in various examples as described herein, be formed on at least one sidewall of at least a portion of the non-volatile resistive memory cell 105 (e.g., to passivate that portion of the non-volatile resistive memory cell against damage, contamination, etc., during subsequent processing of array 100). Other spaces between the top and bottom conductor lines 102, 104 and/or outside the spacer material 109 of the array 100 may be filled with a dielectric material to form an interlayer dielectric (ILD), which for clarity of illustration is not explicitly shown in FIG. 1. As described herein, the spacer material 109 is different from the dielectric material of the ILD in that the spacer material 109 can be selected to be unreactive with the switching element of the non-volatile resistive memory cell or, in various examples, can serve as the switching element.

Figure 2:
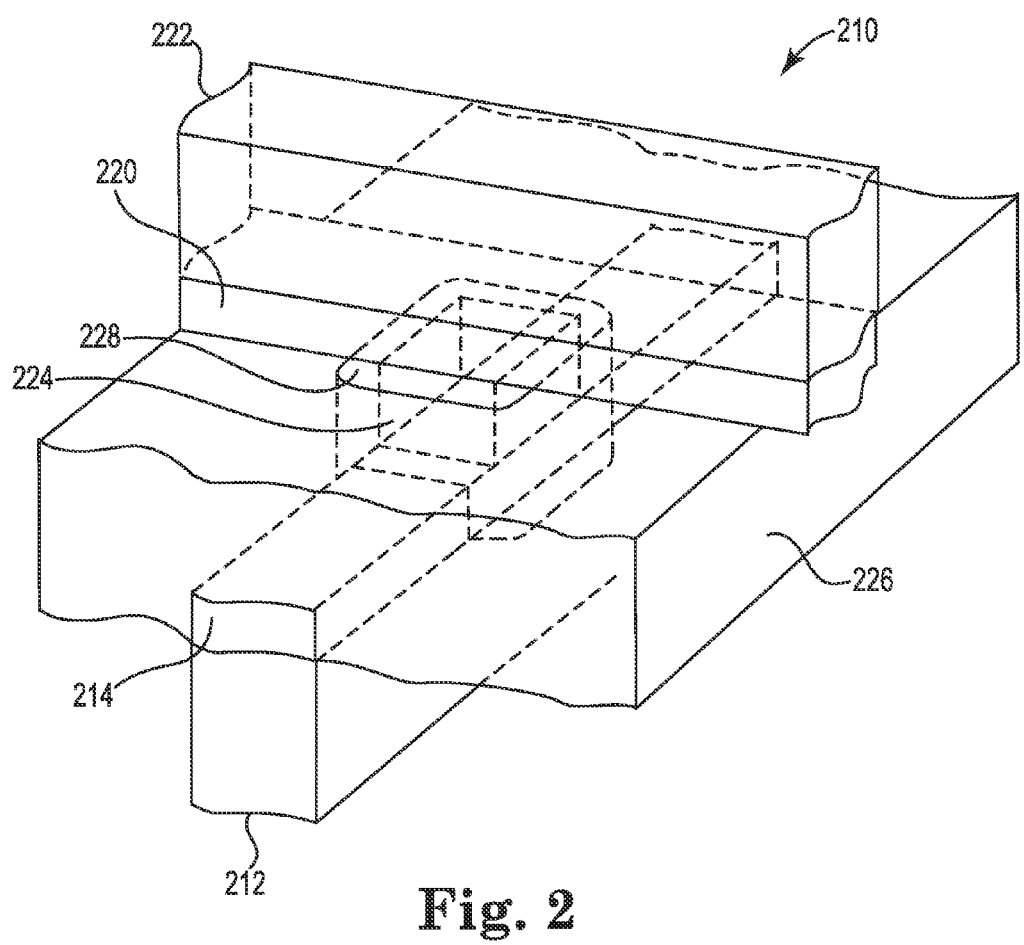
FIG. 2 illustrates an example of a schematic perspective view of a non-volatile resistive memory cell and associated components according to the present disclosure.

FIG. 2 illustrates an example of a schematic perspective view of a non-volatile resistive memory cell and associated components according to the present disclosure. The example of the memory cell and associated components 210 shown in FIG. 2 includes a bottom contact structure that can have a conductive line 212 (e.g., a word line) and a bottom electrode 214, and a top contact structure that includes a top electrode 220 and a conductive line 222 (e.g., a bit line). Between the bottom and top electrodes 214, 220 is a region that contains at least a portion of the material (e.g., including memristive material) for the non-volatile resistive memory cell 224 (e.g., a memristor), which in some examples can include a switching element. As described further herein, a switching element is formed from a memristive material that has electrical characteristics that depend on a state variable (e.g., resistivity) that can be controllably modified to allow a device (e.g., a memristor) to be switched to an ON state with a low-resistance value and an OFF state with a high-resistance value, or intermediate states between the ON and OFF states.

Each of the bottom and top electrodes 214, 220 may have a width on the nanoscale. As used hereinafter, the term "nanoscale" indicates that an object has one or more dimensions less than one micrometer. In some examples, nanoscale can indicate that an object has one or more dimensions less than 100 nanometers (nm). For example, the bottom and top electrodes 214, 220 may have a width in a range of from 5 nm to 500 nm. Likewise, the region that contains at least a portion of the material for the memory cell 224 may have a height that is from a few nanometers to tens of nanometers.

The structure, function, and/or arrangement of the conductive line 212 (e.g., the word line), the bottom electrode 214, the top electrode 220, and/or the conductive line 222 (e.g., the bit line) are presented below by way of example and not by way of limitation. That is, in some examples, the bottom and top electrodes 214, 220 may provide sufficient conductivity and/or low resistance and the word line 212 and bit line 222 may not be necessary or the word line 212 and bit line 222 may provide sufficient conductivity and/or low resistance and the bottom and top electrodes 214, 220 may not be necessary, among other modifications that achieve the same or similar functions.

As such, in the example shown in FIG. 2, the word line 212, bit line 222, and the bottom and top electrodes 214, 220 are electrically conductive but may be formed of different materials. In some examples, the word line 212 and bit line 222 may provide high conductivity and/or low resistance and, as such, may be formed by processes appropriate for forming on the nanoscale, for example, tungsten (W), copper (Cu), and/or aluminum (Al) conductor lines, among other suitably conductive materials. The bottom and top electrodes 214, 220 may be formed of a conductive material selected, for example, to prevent the material thereof from interacting with the switching element material. As such, the conductive material may be a metal such as, for example, platinum (Pt), gold (Au), copper (Cu), tantalum (Ta), tungsten (W), etc., metallic compounds such as, for example, titanium nitride (TiN), tungsten nitride (WN), etc., and/or doped or undoped semiconductor materials, among other suitably conductive materials.

In the example shown in FIG. 2, the top electrode 220 extends at an angle to the bottom electrode 214. The angle may be, for example, around 90 degrees, but may intersect at other angles depending on design choices. Because the bottom and top electrodes 214, 220 are on different planes, and the region that contains the material for the portion of the memory cell 224 may be positioned at an area of overlap between the electrodes, structural support can, in various examples, be provided. Accordingly, spaces around and/or between the bottom and top electrodes 214, 220 and outside the region that contains the material (e.g., including the memristive material) for the portion of the memory cell 224 and associated components can be filled with a dielectric material, in various examples, to form an ILD 226. The ILD 226 can provide structural support and/or electrically insulate the bottom and top electrodes 214, 220. The ILD 226 also can shield (e.g., isolate) the material for the portion of the memory cell 224 and associated components from material of adjacent memory cells (e.g., switching elements) and associated components.

As described in further detail herein, the memory cell and associated components 210 can, in various examples, have a spacer material 228. The spacer material 228 can be different from the material of the ILD 226 in that the spacer material 228 can be selected to be unreactive with a switching element of the memory cell, to protect the switching element from damage, contamination, etc., during subsequent processing (e.g., formation of the ILD), to direct flow of oxygen vacancies, and/or, in various examples, to serve as the switching element. In various examples, the spacer material 228 can be formed on at least one (e.g., one or more) sidewall of the material for the portion of the memory cell 224. In some examples (e.g., as shown in FIG. 2), the spacer material 228 can be formed to surround the sidewalls (e.g., to extend in height between at least the bottom and top electrodes 214, 220). As such, the spacer material can shield (e.g., isolate) the material for the portion of the memory cell 224 from, for example, the ILD 226 and/or other components (e.g., during and after processing and/or formation of the same).

To facilitate understanding of issues addressed by the present disclosure, the components and operational principles of the non-volatile resistive memory cell and associated components 210 (e.g., a memristor) are described with reference to FIG. 2. As shown in FIG. 2, the portion of the memory cell 224 between the bottom and top electrodes 214, 220 can, in various examples, contain memristive material for a switching element. The switching element is capable of carrying a species of mobile ionic dopants such that the dopants can be controllably transported through the switching element and redistributed to change electrical properties of either the switching element or an interface of the switching element and an electrode. This ability to change the electrical properties as a function of dopant distribution allows the switching element to be placed in different switching states by applying a switching voltage from a voltage source (not shown) to the bottom and/or top electrodes 214, 220.

In various examples, the portion of the memory cell 224 between the bottom and top electrodes 214, 220 can include an active region that has two sub-regions: a primary active region and a dopant source region. The primary active region can contain material for the memristive switching element. In various instances, memristive material for the switching element may be electronically resistive (e.g., semiconducting or nominally insulating with a weak ionic conducting capacity).

Many different materials can be used as memristive materials for switching elements. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, including binary, ternary, and quaternary compounds thereof, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. The suitable materials include GeO, SiGe, GeSb, SiGeSb, GeSbTe, and GaInZnO, among other compounds. The II-VI compound materials may also include phase change materials. In addition, PCRAM and STT-RAM technologies can be included as memristive materials. The materials may also include filament structures such as a-Si:Ag that has Ag filaments in an a-Si matrix. These listings of possible switching materials are presented by way of example and do not restrict the scope of the present disclosure.

Dopant species from the dopant source region can be used to alter the electrical properties of the material of the switching element. As utilized in the present disclosure, the dopant species also are considered memristive materials. Which one or more of the dopant species are combined with the material of the switching element depends on the particular type of switching material utilized. As such, the dopant species may be cations, anions, vacancies, and/or impurities acting, for example, as electron donors or acceptors. For instance, in the case of transition metal oxides (TMOs) (e.g., $TiO_2$, $TaO_x$, among others), the dopant species acting as the state variable may be charged oxygen vacancies ($V_O^{2+}$) or ions. For nitrides (e.g., BN, GaN, InN, among others), the dopant species acting as the state variable may be charged nitride vacancies and/or sulfide ions. For compound semiconductors, the dopants acting as the state variable may be n-type or p-type impurities.

The dopant source region can contain a dopant source material that functions as a source/sink of dopants that can be driven into or out of the switching material in the primary active region to alter the overall resistance of the switching element. The dopant source material may be generally the same as the switching material but with a higher dopant concentration. For example, if the switching material is $TiO_2$, the dopant source material may be $TiO_{2-x}$ where x is a number significantly smaller than 1, such as from 0.01 to 0.1. In this case, the $TiO_{2-x}$ material can act as a source/sink of charged oxygen vacancies ($V_O^{2+}$) or ions that can drift into and through the $TiO_2$ switching material in the primary active region. Accordingly, the non-volatile resistive memory cell 210 illustrated in FIG. 2 can be switched between ON and OFF states by controlling the concentration and distribution of dopants in the primary active region.

Switching materials that use dopants (e.g., charged oxygen vacancies or ions) may have a DC switching voltage from a voltage source applied to top and bottom electrodes to create an electric field across the switching element. The electric field, if of sufficient strength and proper polarity, may drive the oxygen vacancies to drift through the switching element toward an electrode, thereby turning the device into an ON state. If the polarity of the electric field is reversed, the oxygen vacancies may drift in an opposite direction across the switching element and away from the electrode, thereby turning the device into an OFF state. In this way, the switching is reversible and may be repeated. Due to a relatively large electric field to cause dopant drifting, after the switching voltage is removed the locations of the oxygen vacancies may remain stable in the switching element. As such, the switching may be non-volatile and the switching element can be utilized for a non-volatile resistive memory cell.

As an example of utilizing memristive materials as described herein, and not by way of limitation, in non-volatile resistive memory cells (e.g., a memristor), a switching oxide (e.g., a TMO such as $TiO_2$) can be substantially lacking oxygen vacancies and can be formed in contact with a sub-oxide (e.g., $Ti_4O_7$) that is rich in oxygen vacancies due, for instance, to insufficient pairing of unpaired Ti electrons with unpaired O electrons. The switching can occur when the charged oxygen vacancies or ions in the sub-oxide migrate into the switching oxide under the influence of an applied electrical field (e.g., to create a conducting channel through the switching oxide).

It is understood in all following examples that the path of least electrical resistance between the top and bottom electrodes traverses through the switching element located immediately between them and not through a path traversing a sidewall spacer and/or the ILD. A notable exception to this is where materials for the sidewall spacer are intentionally selected to be lower in electrical resistance (e.g., less resistive) than materials constituting components that would otherwise be located in a position of the switching element. In that case, the sidewall spacer is the actual switching element, while a stack of materials located immediately between the electrodes contains materials that act as a higher-resistance blocking element (e.g., insulator) that can shunt the electrical path through the sidewall spacer functioning as the switching element.

In some examples, a bottom electrode and a top electrode can sandwich the switching oxide and/or the sub-oxide to form a non-volatile resistive memory cell. In order to form an addressable array of non-volatile resistive memory cells, the top and bottom electrodes can, for example, be patterned (e.g., by suitable etching techniques) into lines, the set of top electrodes generally aligned perpendicularly to the set of bottom electrodes, as shown in FIG. 1.

During formation of such memory cells and/or arrays, the oxide switching element between the bottom electrode and the top electrode may be deposited as a layer that is substantially parallel to an underlying substrate and to layers that constitute precursors for the bottom and top electrodes. When patterned, both the switching oxide and the sub-oxide layers may be deposited onto the substrate and processed together, for instance, patterned (e.g., by suitable etching techniques) into a vertically standing "resistor column" to bridge the two electrodes. This process may introduce damage and/or contamination to the switching oxide, especially at sidewalls of the patterned resistor. For instance, etch-induced damage, such as dangling chemical bonds and/or metallic reaction products or etch residue, etc., could induce creation of electrical paths between the electrodes that are not dependent on intended signals for switching of the oxide (e.g., a TMO). Therefore, it is advantageous to reduce such damage to, and/or contamination, of the switching oxide and/or associated components. In various examples presented herein, such damage and/or contamination can be reduced (e.g., passivated) by forming (e.g., depositing) at least a portion of the switching element (e.g., a TMO) and/or associated components after a number of particular portions of the processing has been performed (e.g., depositing and/or etching of other components).

Figure 3:
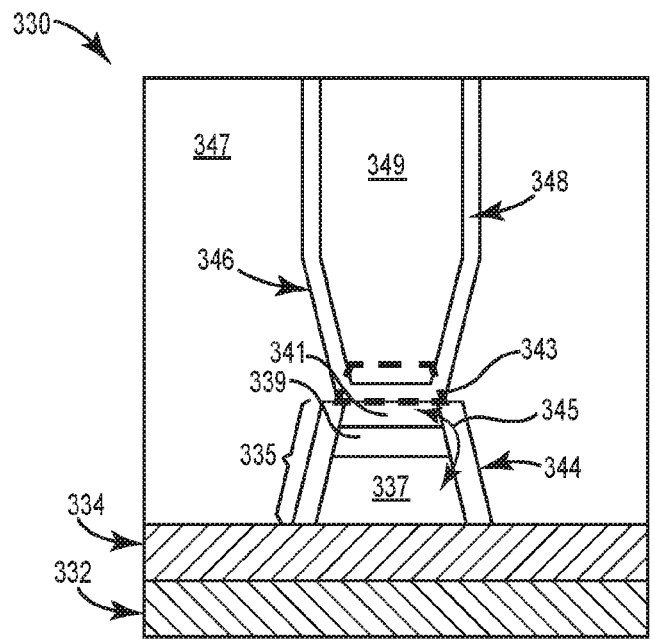
FIG. 3 is an example of a schematic cross-sectional view of a non-volatile resistive memory cell with a switching element formed on a sidewall of a first portion thereof according to the present disclosure.

FIG. 3 is an example of a schematic cross-sectional view of a non-volatile resistive memory cell with a switching element formed on a sidewall of a first portion thereof according to the present disclosure. The non-volatile resistive memory cell (e.g., a memristor) and associated components 330 illustrated in FIG. 3 show a schematic cross-sectional view of a conductive line 332 (e.g., a word line) and a bottom electrode 334 formed thereon or, in some examples, precursors thereof (e.g., layers of conductive line and bottom electrode materials). As illustrated, the conductive line 332 and the bottom electrode 334 extend left to right substantially in the plane of FIG. 3. In some examples, the conductive line 332 and the precursor thereof can be formed from a material that includes tungsten (W), although other materials can be used (e.g., aluminum (Al) and/or copper (Cu), among others), and the bottom electrode 334 and the precursor thereof can be formed from a material that includes titanium nitride (TiN), although other materials can be used (e.g., tantalum nitride (TaN) and/or platinum (Pt), among others).

As an example of utilizing memristive materials as described herein, and not by way of limitation, a sub-oxide layer, as described herein, can be formed (e.g., deposited) on an exposed surface of the precursor layer of the bottom electrode. In various examples, an insulating layer can be formed (e.g., deposited) on an exposed surface of the sub-oxide layer and a precursor layer for a second electrode can be formed (e.g., deposited) on an exposed surface of the insulating layer. The precursor layer for the second electrode can, in some examples, be formed to serve as a hard mask for subsequent etching processes. For example, suitable patterning and etching techniques can be utilized to form a vertically-extending first portion of the non-volatile resistive memory cell 335 on the bottom electrode 334, where the first portion 335 has a sub-oxide 337, an insulator 339, and/or at least part of a second electrode 341 extending across a width of the first portion 335. In some examples, at least part of the second electrode precursor serving as the hard mask 343 can be removed by the etching technique that forms the vertically-extending first portion of the non-volatile resistive memory cell 335.

A switching material 344 (e.g., a switching element) can be formed (e.g., deposited) as a second portion of the non-volatile resistive memory cell on at least one sidewall of the vertically-extending first portion of the non-volatile resistive memory cell 335. Deposition of the switching material 344 can be implemented by spin coating, blanket coating, chemical vapor deposition (CVD), plasma enhanced chemical vapor deposition (PECVD), physical vapor deposition (PVD), atomic layer deposition (ALD), and/or plasma enhanced atomic layer deposition (PEALD), among other techniques. For example, the switching material 344 can be deposited (e.g., to substantially a uniform thickness via ALD) to a nanoscale thickness (e.g., up to 5 nm thick) to form a vertically-extending structure as the switching element. In some examples, the switching material 344 can be formed to surround the sidewalls of the vertically-extending first portion of the non-volatile resistive memory cell 335 (e.g., as shown in FIG. 2).

The nanoscale thickness of the switching element 344 can define a size of a current path 345 between the sub-oxide 337 and the part of a second electrode 341. When the current path 345 between the first electrode 334 and the second electrode 341 is directed (e.g., by the insulator 339) through the vertically-extending switching element 344, the effective junction area can be reduced to the cross-sectional area of the thickness of the junction, thereby reducing an OFF state current and an overall current level. In some examples, the vertically-extending switching element 344 may be protected (e.g., passivated) from further processing by an insulating layer (not shown) that covers the vertically-extending switching element 344. In some examples, the vertically-extending switching element 344 and/or the insulating layer can be formed into a sidewall spacer structure along the sidewalls of the first portion of the non-volatile resistive memory cell 335 (e.g., via anisotropic vertical reactive ion etching).

An ILD 347 material can, in various examples, be formed (e.g., deposited) on the portions of the non-volatile resistive memory cell (e.g., 335 and 344) just described. A trench 346 can be formed in the ILD 347 (e.g., via suitable patterning and/or etching techniques, such as photolithography and/or wet or dry etching techniques, among others) with a long axis substantially orthogonal to the conductive line 332 and/or the bottom electrode 334 and to a depth that exposes at least a portion of a surface of the portion of the second electrode 341.

Another portion of the second electrode 348 can, in various examples, be formed (e.g., deposited) in the trench 346 to connect with the previously formed portion of the second electrode 341. The two portions of the second electrode 341, 348 can be formed from the same or different materials. In various examples, the material for the second electrode 348 can be deposited (e.g., to a substantially uniform thickness via ALD) to form a cavity 349 in the trench 346. The cavity 349 can be filled with suitable material (e.g., via suitable deposition techniques) to form a conductive line (e.g., a bit line). There may be multiple non-volatile resistive memory cells (e.g., memristors) and associated components 330 formed as just described into an array, as presented with regard to FIGS. 1 and 2.

The non-volatile resistive memory cells (e.g., memristors) and associated components 330 can be formed from various materials, as described herein by way of example and not by way of limitation. For example, when present, a sub-oxide (e.g., as shown in FIGS. 3-4 and 6-7) can be formed from at least one TMO. The switching element (e.g., as shown in FIGS. 3-4 and 6-7) can be formed from at least one TMO that is more resistive (e.g., less oxygen-deficient) than the sub-oxide. That is, the sub-oxide material can have more charged oxygen vacancies or ions than the switching element material. For example, the switching material can be $TiO_2$, $TaO_x$, among others, and the sub-oxide material can be $TiO_{2-x}$ (e.g., $Ti_2O_3$), $TaO_{x-y}$, among others.

An insulator (e.g., as shown in FIG. 3) can, for example, be formed from $SiO_2$ and/or $Si_3N_4$, among other suitable insulating materials. The ILD can, for example, be formed from a silicon oxide (e.g., $SiO_2$), a silicon nitride, and/or a silicon carbon nitride, among others. The top conductive line (e.g., bit line) (e.g., as shown in FIGS. 3-4 and 6-7) can, in some examples, be formed from the same material as the bottom conductive line (e.g., word line) (e.g., tungsten (W)) or a different material (e.g., copper (Cu), and/or aluminum (Al), among other suitably conductive materials). The portions of the second electrode (e.g., as shown in FIGS. 3-4 and 6-7) can, in some examples, be formed from the same material as the first electrode (e.g., TiN) or a different material (e.g., tantalum nitride (TaN) and/or platinum (Pt), among other suitably conductive materials).

Figure 4:
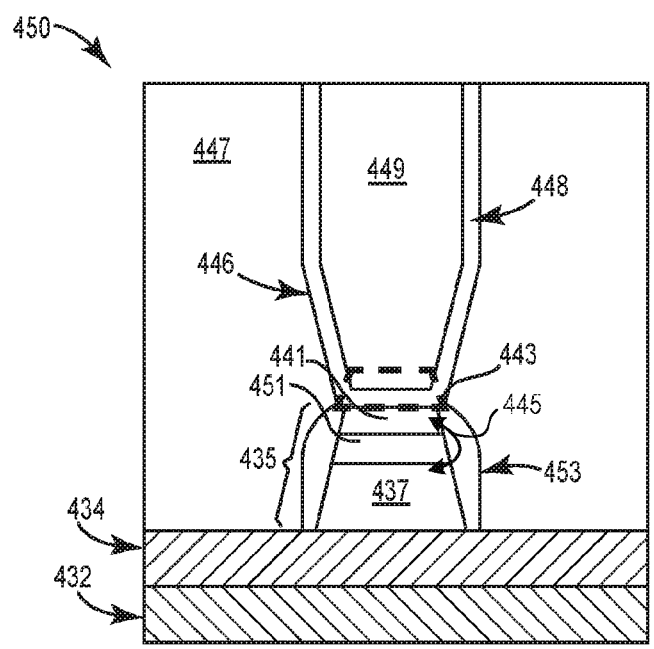
FIG. 4 is an example of a schematic cross-sectional view of a non-volatile resistive memory cell with a spacer formed on a sidewall thereof according to the present disclosure.

FIG. 4 is an example of a schematic cross-sectional view of a non-volatile resistive memory cell with a spacer formed on a sidewall thereof according to the present disclosure. The non-volatile resistive memory cell (e.g., a memristor) and associated components 450 illustrated in FIG. 4 show a schematic cross-sectional view of a conductive line 432 (e.g., a word line) and a bottom electrode 434 formed thereon or, in some examples, precursors thereof (e.g., layers of conductive line and bottom electrode materials), substantially as described with regard to FIG. 3.

As an example of utilizing memristive materials as described herein, and not by way of limitation, a sub-oxide layer, as described herein, can be formed (e.g., deposited) on an exposed surface of the precursor layer of the bottom electrode. In various examples, a switching material layer can be formed (e.g., deposited) on an exposed surface of the sub-oxide layer and a precursor layer for a second electrode can be formed (e.g., deposited) on an exposed surface of the switching material layer. The precursor layer for the second electrode can, in some examples, be formed to serve as a hard mask for subsequent etching processes. For example, suitable patterning and etching techniques can be utilized to form a vertically-extending first portion of the non-volatile resistive memory cell 435 on the bottom electrode 434, where the first portion 435 has a sub-oxide 437, a switching element 451, and/or at least part of a second electrode 441 extending across a width of the first portion 435. In some examples, at least part of the second electrode precursor serving as the hard mask 443 can be removed by the etching technique that forms the vertically-extending first portion of the non-volatile resistive memory cell 435. Current path 445 is shown between the first electrode 434 and the second electrode 441.

In some examples, the vertically-extending first portion of the non-volatile resistive memory cell 435 may be protected (e.g., passivated) from further processing by a spacer layer 453 that covers the vertically-extending first portion of the non-volatile resistive memory cell 435, including the switching element 451. In some examples, the spacer layer 453 can be formed into a sidewall spacer structure along the sidewalls of the first portion of the non-volatile resistive memory cell 435 (e.g., via anisotropic vertical reactive ion etching). In some examples, the spacer layer 453 can be formed to surround the sidewalls of the vertically-extending first portion of the non-volatile resistive memory cell 435 (e.g., as shown in FIG. 2).

As described herein, the non-volatile resistive memory cells (e.g., memristors) and associated components 450 can be formed from various materials, as described herein by way of example and not by way of limitation. For example, when present, a sub-oxide (e.g., as shown in FIGS. 3-4 and 6-7) can be formed from at least one TMO. The switching element (e.g., as shown in FIGS. 3-4 and 6-7) can be formed from at least one TMO that is more resistive (e.g., less oxygen-deficient) than the sub-oxide. That is, the sub-oxide material can have more charged oxygen vacancies or ions than the switching element material. For example, the switching material can be $TiO_2$, $TaO_x$, among others, and the sub-oxide material can be $TiO_{2-x}$ (e.g., $Ti_2O_3$), $TaO_{x-y}$, among others. The spacer layer 453 shown in FIG. 4 can be formed from a material that is no more resistive (e.g., no less oxygen-deficient) than the switching element material. For example, the spacer layer 453 and the switching element 451 both can be formed from $TiO_2$, or the spacer layer 453 can be formed from $Ta_2O_5$ when the switching element 451 is formed from $TiO_2$, among other such combinations.

FIG. 4 shows that (e.g., similar to FIG. 3) an ILD 447 material can, in various examples, be formed (e.g., deposited) on the portions of the non-volatile resistive memory cell (e.g., 435 and 453) just described. A trench 446 can be formed in the ILD 447 (e.g., via suitable patterning and/or etching techniques) with a long axis substantially orthogonal to the conductive line 432 and/or the bottom electrode 434 and to a depth that exposes at least a portion of a surface of the portion of the second electrode 441.

Another portion of the second electrode 448 can, in various examples, be formed (e.g., deposited) in the trench 446 to connect with the previously formed portion of the second electrode 441. In various examples, the material for the second electrode 448 can be deposited (e.g., to a substantially uniform thickness via ALD) to form a cavity 449 in the trench 446. The cavity 449 can be filled with suitable material (e.g., via suitable deposition techniques) to form a conductive line (e.g., a bit line). There may be multiple non-volatile resistive memory cells (e.g., memristors) and associated components 450 formed as just described into an array, as presented with regard to FIGS. 1 and 2.

Figure 5:
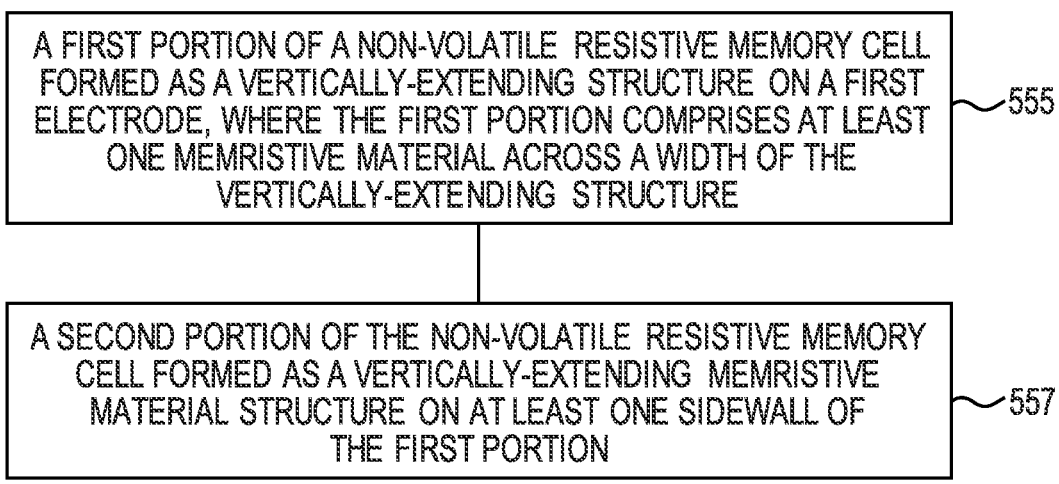
FIG. 5 is a block diagram of a non-volatile resistive memory cell formed according to the present disclosure.

FIG. 5 is a block diagram of a non-volatile resistive memory cell formed according to the present disclosure. As shown in block 555 and consistent with the examples illustrated in FIGS. 3 and 4, a non-volatile resistive memory cell can include a first portion of the non-volatile resistive memory cell formed as a vertically-extending structure (e.g., 335, 435) on a first electrode (e.g., 334, 434), where the first portion comprises at least one memristive material (e.g., 337 or 437 and 451) across a width of the vertically-extending structure. As shown in block 557, the non-volatile resistive memory cell also can include a second portion formed as a vertically-extending memristive material structure on at least one sidewall of the first portion (e.g., 344, 453).

As described herein, among other possibilities, the memristive material can be formed from at least one TMO (e.g., various oxides of Ti and/or Ta, among others). As further described herein, the second portion can, for example, surround sidewalls of the first portion to passivate the first portion (e.g., from subsequent processing). The first portion (e.g., 335) can, in various examples, include a first memristive material (e.g., 337) and the second portion (e.g., 344) can include a second memristive material as a switching element, where the second memristive material is more resistive than the first memristive material. The first portion (e.g., 335) can, in various examples, include an insulator (e.g., 339) between the first memristive material (e.g., 337) and a second electrode (e.g., 341). Alternatively, the first portion (e.g., 435) can, in various examples, include a first memristive material (e.g., 437) and a second memristive material (e.g., 451), where the second memristive material is a switching element and is more resistive than the first memristive material, and the second portion (e.g., 453) can, in various examples, include a third memristive material that is no less resistive than the second memristive material.

Figure 6:
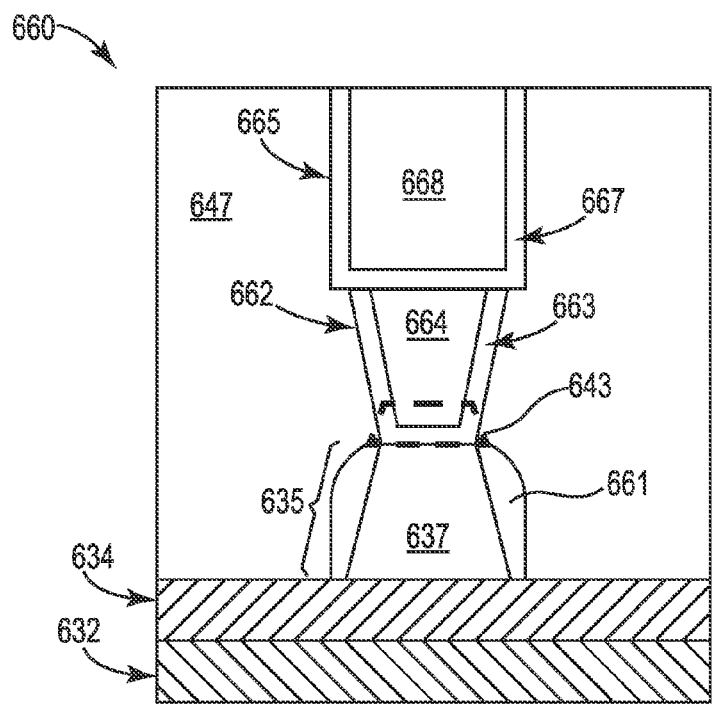
FIG. 6 is an example of a schematic cross-sectional view of a non-volatile resistive memory cell with a switching element formed on a sidewall of a top electrode according to the present disclosure.

FIG. 6 is an example of a schematic cross-sectional view of a non-volatile resistive memory cell with a switching element formed on a sidewall of a top electrode according to the present disclosure. The non-volatile resistive memory cell (e.g., a memristor) and associated components 660 illustrated in FIG. 6 shows a schematic cross-sectional view of a conductive line 632 (e.g., a word line) and a bottom electrode 634 formed thereon or, in some examples, precursors thereof (e.g., layers of conductive line and bottom electrode materials), as described herein.

As an example of utilizing memristive materials as described herein, and not by way of limitation, a sub-oxide layer, as described herein, can be formed (e.g., deposited) on an exposed surface of the precursor layer of the bottom electrode. In various examples, a hard mask for subsequent etching processes can be formed (e.g., deposited) on an exposed surface of the sub-oxide layer. For example, suitable patterning and/or etching techniques can be utilized to form a vertically-extending first portion of the non-volatile resistive memory cell 635 on the bottom electrode 634, where the first portion 635 has a sub-oxide 637 extending across a width of the first portion 635. In some examples, the hard mask 643 can be removed by the etching technique that forms the vertically-extending first portion of the non-volatile resistive memory cell 635 to expose at least a portion of a surface of the sub-oxide 637.

In some examples, the vertically-extending first portion of the non-volatile resistive memory cell 635 may be protected (e.g., passivated) from further processing by a spacer layer 661 that covers the vertically-extending first portion of the non-volatile resistive memory cell 635. In some examples, the spacer layer 661 can be formed into a sidewall spacer structure along the sidewalls of the first portion of the non-volatile resistive memory cell 635 (e.g., via anisotropic vertical reactive ion etching). In some examples, the spacer layer 661 can be formed to surround the sidewalls of the vertically-extending first portion of the non-volatile resistive memory cell 635 (e.g., as shown in FIG. 2). The spacer layer 661 can, for example, be formed from a material that is substantially non-reactive with the sub-oxide 637 and/or an ILD 647 material (e.g., various nitrides, such as a silicon nitride and/or a silicon carbon nitride, among others). An ILD 647 material can, in various examples, be formed (e.g., deposited) on the first portion of the non-volatile resistive memory cell (e.g., 635) just described.

A trench can be formed in the ILD 647 (e.g., via suitable patterning and/or etching techniques) with a long axis substantially orthogonal to the conductive line 632 and/or the bottom electrode 634 and to a depth that exposes at least a portion of a surface of the sub-oxide 637. In various examples, the trench can be formed to have two parts. For example, the trench can have a lower part 662 that exposes at least the portion of the surface of the sub-oxide 637. In some examples, the lower part of the trench 662 can be formed with a frustoconical cross-section having a truncated end exposing at least the portion of the surface of the sub-oxide 637 and a wider distal end connecting with an upper part 665 of the trench at a particular height above the truncated end. As such, sidewalls of the lower part 662 can be formed at angles to connect with the upper part 665 that is wider than the truncated end of the lower part 662 of the trench and, in some examples, the wider distal end of the lower part 662 of the trench. The upper part 665 can, in some examples, have sidewalls formed substantially perpendicular to the conductive line 632 and/or the bottom electrode 634.

A second portion of the of the non-volatile resistive memory cell can be formed (e.g., deposited to a substantially uniform thickness via ALD) as a switching material 663 (e.g., a switching element) on at least one sidewall of the lower portion 662 of the trench as a vertically-extending structure (e.g., in contact with at least a portion of the exposed surface of the sub-oxide 637 and extending to the particular height above the truncated end) to connect with, for example, the upper part 665 of the trench. In some examples, the switching material 663 (e.g., the switching element) can be formed to cover both sidewalls of the lower part 662 of the trench to the particular height, along with substantially the entire exposed upper surface of the sub-oxide 637. As such, a first cavity 664 can, in various examples, be formed within the switching element 663 in the lower part 662 of the trench.

Forming the switching element 663 subsequent to, for example, suitable patterning and/or etching techniques utilized to form the vertically-extending first portion of the non-volatile resistive memory cell 635, forming the ILD 647, and/or suitable patterning and/or etching techniques utilized to form the upper 665 and/or lower 662 portions of the trench can reduce damage and/or contamination (e.g., passivate) resulting from such processing (e.g., to the switching element 663).

In some examples, at least a portion of a second electrode material (e.g., as described herein) can be formed (e.g., deposited) within the first cavity 664 to form a via within the first cavity 664. The second electrode material can, in some examples, form the via within the first cavity 664 to substantially the particular height above the truncated end to connect with, for example, the upper part 665 of the trench. Hence, the switching element 663 is formed on the sidewalls of the via (e.g., the second, or top, electrode) within the first cavity 664.

In some examples, at least a portion of a second electrode material 667 can be formed (e.g., deposited to a substantially uniform thickness via ALD) in the upper part 665 of the trench. The second electrode material 667 (as described herein) can be the same as or different from the second electrode material utilized to form the via within the first cavity 664. When utilized, the second electrode material 667 can cover the sidewalls and the bottom of upper part 665 of the trench to connect with the second electrode material utilized to form the via within the first cavity 664. The second electrode material 667 can be formed (e.g., deposited) within the upper part 665 of the trench to form a second cavity 668.

A conductive material (e.g., as described herein) can, in various examples, be formed (e.g., deposited) within the second cavity 668 (e.g., to form a top conductive material or bit line). In some examples, the conductive material can, in various examples, be formed (e.g., deposited) directly within the upper part 665 of the trench (e.g., without the second electrode material 667) to connect with the second electrode material utilized to form the via within the first cavity 664. There may be multiple non-volatile resistive memory cells (e.g., memristors) and associated components 660 formed as just described into an array, as presented with regard to FIGS. 1 and 2.

Figure 7:
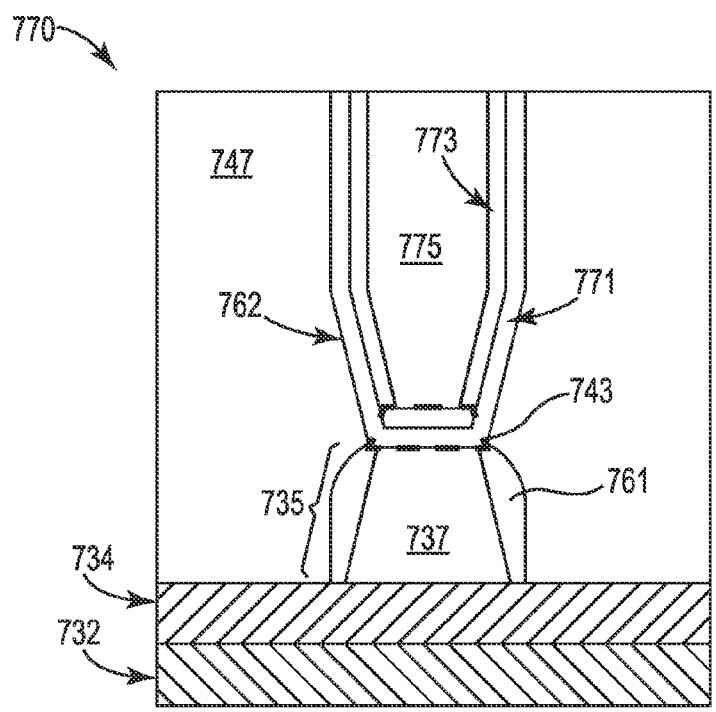
FIG. 7 is another example of a schematic cross-sectional view of a non-volatile resistive memory cell with a switching element formed on a sidewall of a top electrode according to the present disclosure.

FIG. 7 is another example of a schematic cross-sectional view of a non-volatile resistive memory cell with a switching element formed on a sidewall of a top electrode according to the present disclosure. The non-volatile resistive memory cell (e.g., a memristor) and associated components 770 illustrated in FIG. 7 show a schematic cross-sectional view of a conductive line 732 (e.g., a word line) and a bottom electrode 734 formed thereon or, in some examples, precursors thereof (e.g., layers of conductive line and bottom electrode materials), as described herein.

Suitable patterning and/or etching techniques can be utilized to form a vertically-extending first portion of a non-volatile resistive memory cell 735 on the bottom electrode 734 substantially as described herein with regard to FIG. 6. An ILD 747 material can, in various examples, be formed (e.g., deposited) on the first portion of the non-volatile resistive memory cell (e.g., 735) substantially as described herein.

A trench 762 can be formed in the ILD 747 (e.g., via suitable patterning and/or etching techniques) with a long axis substantially orthogonal to the conductive line 732 and/or the bottom electrode 734 and to a depth that exposes at least a portion of a surface of the sub-oxide 737. In various examples, the trench can be formed to have a lower part that exposes at least the portion of the surface of the sub-oxide 737. In some examples, the lower part of the trench can be formed with a frustoconical cross-section having a truncated end exposing at least the portion of the surface of the sub-oxide 737 and a wider distal part transitioning to an upper part of the trench (e.g., at a particular height above the truncated end). As such, sidewalls of the lower part of the trench 762 can be formed at angles to connect with the upper part of the trench 762 that is wider than the truncated end of the lower part of the trench. The upper part of the trench 762 can, in some examples, have sidewalls formed substantially perpendicular to the conductive line 732 and/or the bottom electrode 734.

A second portion of the of the non-volatile resistive memory cell can be formed (e.g., deposited to a substantially uniform thickness via ALD) as a switching material 771 (e.g., a switching element) on at least one sidewall of the lower portion of the trench 762 as a vertically-extending structure (e.g., in contact with at least a portion of the exposed surface of the sub-oxide 737). The switching material 771 can, in various examples, extend to whatever height is selected for a particular application (e.g., to a top of the trench 762 and/or the ILD 747). In some examples, the switching material 771 (e.g., the switching element) can be formed to cover both sidewalls of the trench 762 to the selected height, along with substantially the entire exposed upper surface of the sub-oxide 737. As such, a first cavity (not shown) can, in various examples, be formed within the switching element 771 in the trench 762.

Forming the switching element 771 subsequent to, for example, suitable patterning and/or etching techniques utilized to form the vertically-extending first portion of the non-volatile resistive memory cell 735, forming the ILD 747, and/or suitable patterning and/or etching techniques utilized to form the portions of the trench 762 can reduce damage and/or contamination (e.g., passivate) resulting from such processing (e.g., to the switching element 771).

In some examples, a second electrode material (e.g., as described herein) can be formed (e.g., deposited to a substantially uniform thickness via ALD) within the first cavity to form a second electrode 773 within the first cavity. The second electrode 773 can, in some examples, be formed within the first cavity to substantially the selected height of the switching element 771 in the trench 762. Hence, the switching element 771 is formed on the sidewalls of the second, or top, electrode within the first cavity.

The second electrode material 773 can cover the sidewalls and the bottom of the trench 762 to form a second cavity 775. A conductive material (e.g., as described herein) can, in various examples, be formed (e.g., deposited) within the second cavity 775 (e.g., to form a top conductive material or bit line). There may be multiple non-volatile resistive memory cells (e.g., memristors) and associated components 770 formed as just described into an array, as presented with regard to FIGS. 1 and 2.

Accordingly, consistent with the examples illustrated in FIGS. 6 and 7, a non-volatile resistive memory cell can include a first portion of the non-volatile resistive memory cell formed as a first vertically-extending memristive material structure (e.g., 635, 735) on a first electrode (e.g., 634, 734). The non-volatile resistive memory cell also can include a second portion of the non-volatile resistive memory cell (e.g., 663, 771) formed on at least one sidewall of a trench (e.g., 662, 762) as a second vertically-extending memristive material structure to contact an exposed upper surface of the first vertically-extending memristive material structure (e.g., 637, 737), where the second memristive material is a switching element.

In some examples, the first vertically-extending memristive material structure (e.g., 635, 735) is formed substantially from a sub-oxide, as described herein. In various examples, the second portion of the non-volatile resistive memory cell (e.g., 663, 771) can cover the exposed upper surface of the first vertically-extending memristive material structure (e.g., 637, 737) and sidewalls of the trench (e.g., 662, 762) to form a first cavity (e.g., 564). At least a portion of the second electrode can, in various examples, be formed as a via within the first cavity 564. At least a portion of the second electrode can, in various examples, cover a surface of the first cavity to form a second cavity (e.g., 568, 675).

As such, a method of forming a non-volatile resistive memory cell, consistent with FIGS. 3-7, can include forming a precursor of a first portion of the non-volatile resistive memory cell as a vertically-extending structure (e.g., 335, 435, 635, 735) on a first electrode (e.g., 334, 434, 634, 734), where the first portion comprises at least one memristive material across a width of the vertically-extending structure (e.g., 337, 437, 451, 637, 737) and a hard mask material (e.g., 343, 443, 643, 743) above the at least one memristive material, where etching the precursor of the first portion of the non-volatile resistive memory cell can be utilized to form a patterned first portion of the non-volatile resistive memory cell (e.g., 335, 435, 635, 735). The patterned first portion of the non-volatile resistive memory cell (e.g., 335, 435, 635, 735) can be passivated by forming a spacer material around sidewalls (e.g., 344, 453, 661, 761) of the patterned first portion. Unless explicitly stated, the method examples described herein are not constrained to a particular order or sequence. Additionally, some of the described method examples, or elements thereof, can occur or be performed at the same, or substantially the same, point in time.

In various examples, forming the spacer material around the sidewalls (e.g., 344, 453, 661, 761) includes forming a memristive material that vertically-extends (e.g., 344, 453) from the first electrode (e.g., 334, 434, 634, 734) to a height of an upper one of the at least one memristive material (e.g., 337, 451, 637, 737) or a remaining portion of the hard mask material (e.g., 341, 441, 643, 743) of the patterned first portion (e.g., 335, 435, 635, 735). That is, as selected for a particular application, the spacer material around the sidewalls (e.g., 344, 453, 661, 761) can extend from the first electrode to a top of an upper memristive material (e.g., a sub-oxide or a switching element) or to a top of the remaining portion of the hard mask material. In various examples, forming the memristive material that vertically-extends (e.g., 344, 453) includes forming a memristive material that is no less resistive than the least resistive of the at least one memristive material (e.g., 337, 437, 451, 637, 737) of the patterned first portion (e.g., 335, 435, 635, 735).

In various examples, a trench (e.g., 346, 446, 662, 665, 762) can be formed in an ILD material (e.g., 347, 447, 647, 737) to expose at least part of a surface of the upper one of the at least one memristive material (e.g., 637, 737) or the remaining portion of the hard mask material (e.g., 341, 441) and, in various examples, a second portion of the non-volatile resistive memory cell can be formed as a switching element (e.g., 663, 771) to cover the exposed surface and sidewalls of the trench to form a first cavity (e.g., 564). At least a portion of a second electrode can, in various examples, be formed as a via within the first cavity (e.g., 564). At least a portion of a second electrode (e.g., 773) can, in various examples, be formed to cover a surface of the first cavity to form a second cavity (e.g., 568).

Examples of the present disclosure can include non-volatile resistive memory cells (e.g., memristors) apparatuses, systems, and methods, including executable instructions and/or logic to facilitate fabricating and/or operating the non-volatile resistive memory cells (e.g., memristors), apparatuses, and systems. Processing resources can include one or more processors able to access data stored in memory to execute the formations, actions, functions, etc., as described herein. As used herein, "logic" is an alternative or additional processing resource to execute the formations, actions, functions, etc., described herein, which includes hardware (e.g., various forms of transistor logic, application specific integrated circuits (ASICs), etc.), as opposed to computer executable instructions (e.g., software, firmware, etc.) stored in memory and executable by a processor.

It is to be understood that the descriptions presented herein have been made in an illustrative manner and not a restrictive manner. Although specific examples for non-volatile resistive memory cell (e.g., memristor) apparatuses, systems, methods, computing devices, and instructions have been illustrated and described herein, other equivalent component arrangements, instructions, and/or device logic can be substituted for the specific examples presented herein without departing from the spirit and scope of the present disclosure.

What is claimed:

1. A non-volatile resistive memory cell, comprising:
   a first portion of the non-volatile resistive memory cell formed as a vertically-extending structure on a first electrode, wherein the first portion comprises a first memristive material across a width of the vertically-extending structure;
   a second portion of the non-volatile resistive memory cell formed as a vertically-extending memristive material structure on at least one sidewall of the first portion, wherein the second portion comprises a second memristive material as a switching element, and wherein the second memristive material is more resistive than the first memristive material; and
   an insulator between the first memristive material and a second electrode.

2. The memory cell of claim 1, wherein the first memristive material is formed from at least one transition metal oxide.

3. A non-volatile resistive memory cell, comprising:
   a first portion of the non-volatile resistive memory cell formed as a first vertically-extending memristive material structure on a first electrode;
   a second portion of the non-volatile resistive memory cell formed on at least one sidewall of a trench as a second vertically-extending memristive material structure to contact an exposed upper surface of the first vertically-extending memristive material structure, wherein the second memristive material is a switching element and more resistive than the first memristive material, wherein the second portion covers the exposed upper surface of the first vertically-extending memristive material structure and sidewalls of the trench to form a first cavity; and
   a second electrode that covers a surface of the first cavity to form a second cavity.

4. The memory cell of claim 1, wherein the first portion comprises a sub-oxide, an insulator, and a first portion of the second electrode extending across the width of the vertically-extending structure.

5. The memory cell of claim 4, wherein the sub-oxide forms a first layer, the insulator forms a second layer, and the first portion of the second electrode forms a third layer, and wherein the first layer is disposed on the first electrode, the second layer is disposed on the first layer, and third layer is disposed on the second layer.

6. The memory cell of claim 4, wherein a second portion of the second electrode is formed on at least one sidewall of a trench as a vertically-extending structure to contact an exposed upper surface of the first portion of the second electrode.

7. The memory cell of claim 1, wherein the second portion of the non-volatile resistive memory cell surrounds the sidewalls of the first portion.

\* \* \* \* \*